(12) United States Patent
Toyoda

(10) Patent No.: US 7,404,982 B2
(45) Date of Patent: Jul. 29, 2008

(54) COLOR FILTER FORMING METHOD

(75) Inventor: Naoyuki Toyoda, Suwa (JP)

(73) Assignee: Seiko Epson Corporation (JP)

( * ) Notice: Subject to any disclaimer, the term of this patent is extended or adjusted under 35 U.S.C. 154(b) by 390 days.

(21) Appl. No.: 11/251,370

(22) Filed: Oct. 14, 2005

(65) Prior Publication Data
US 2006/0115749 A1 Jun. 1, 2006

(30) Foreign Application Priority Data
Nov. 30, 2004 (JP) ............................ 2004-345444

(51) Int. Cl.
*B05D 5/06* (2006.01)
(52) U.S. Cl. ........................... 427/162; 427/166; 430/7
(58) Field of Classification Search ................ 427/162, 427/166; 430/7
See application file for complete search history.

(56) References Cited

U.S. PATENT DOCUMENTS 6,399,257 B1 6/2002 Shirota et al.

7,335,520 B2 * 2/2008 Kim ........................... 438/22
2006/0108905 A1 * 5/2006 Cho et al. .................... 313/292

FOREIGN PATENT DOCUMENTS

| JP | 09-203803 | 8/1997 |
|----|-----------|--------|
| JP | 09-230123 | 9/1997 |
| JP | 2000-258622 | 9/2000 |
| JP | 2001-272527 | 10/2001 |
| JP | 2006-156426 | 6/2006 |
| KR | 10-2006-0059171 | 6/2006 |

OTHER PUBLICATIONS

JPO; machine translation of JP 2006-156426; 2008.*
JPO; machine translation of JP 09-230123; 2008.*
Communication from Korean Patent Office regarding counterpart application.

* cited by examiner

*Primary Examiner*—Alain L Bashore
(74) *Attorney, Agent, or Firm*—Harness, Dickey & Pierce, P.L.C.

(57) ABSTRACT

A color filter forming method, includes: forming a bank on a substrate; making the substrate and part or all of the bank lyophilic; and coating a liquid repellent on part or all of an upper surface of the bank.

8 Claims, 11 Drawing Sheets

COLOR FILTER FORMING METHOD

BACKGROUND OF THE INVENTION

1. Technical Field

The invention relates to a manufacturing method of a color filter using an inkjet method.

2. Related Art

In color filter formation according to the inkjet method, pattern microminiaturization is carried on through a concave partition member (hereinafter referred to as the "bank") disposed on a substrate. To store a filter material (hereinafter referred to as the "ink") ejected by the inkjet method in a concavity (hereinafter referred to as the "bank groove") which is formed by the bank and the substrate, the bank is liquid repellent and the substrate is lyophilic so as to prevent the ink from flowing over the bank (for example, as disclosed in JP-A-2001-272527).

JP-A-11-272527 is an example of related art.

However, when the bank is made liquid repellent, the ink ejected from an inkjet head shrinks due to the liquid repellency of the bank and becomes round, whereby a color in a vicinity of a center of the bank presents heavy density while a color in the vicinity of the bank presents light density, thus vitiating performance as a color filter.

SUMMARY

An advantage of some aspects of the invention is to provide a method of forming a color filter, which permits a sufficient amount of ink to remain in the bank groove with a simpler method, having little difference in density of color inside the bank groove and a large contrast ratio.

According to a first aspect of the invention, a method includes forming a bank on the substrate, converting part or all of the substrate and the bank to be lyophilic, and coating a liquid repellent on part or all of an upper surface of the bank.

In this case, by converting part or all of the substrate and the bank to be lyophilic, the inside of the bank groove becomes fully lyophilic such that a sufficient amount of the ink can be made to stay. Further, by coating the liquid repellent on part or all of the upper surface of the bank, the ink is prevented from going across the bank, while, at the same time, if the ink ejected from the inkjet head impacts on the bank, it is possible to prevent the ink on the bank from being drawn into the bank groove and getting muddy with the ink of the adjacent bank.

The liquid repellent of the invention is deposited on a plate member other than the substrate, so that the plate member and the bank on the substrate are in contact with each other, thereby enabling the liquid repellent to transfer part or all of the upper surface of the bank.

According to this, the liquid repellent is deposited on the plate member other than the substrate, so that the plate member and the bank on the substrate are in contact with each other, thereby enabling the liquid repellent to transfer part or all of the upper surface of the bank. Hence, the liquid repellent can be provided on part or all of the upper surface of the bank without affecting the bank groove which has been made to be lyophilic.

A material of the bank of the invention is an inorganic material or an organic material.

According to this, the invention is applicable regardless of the material of the bank.

A height of the bank of the invention is more than 1 μm

According to this, when providing the liquid repellent on part or all of the upper surface of the bank, if the height of the bank is more than 1 μm, it is possible to prevent the liquid repellent from being deposited inside the bank groove.

The bank of the invention is disposed on a shielding layer.

According to this, the bank is provided on the shielding layer disposed on the substrate. By making the substrate, the bank, and part or all of the shielding layer lyophilic, the inside of the bank groove is completely made lyophilic, whereby it is possible to make the ink uniformly stay in the bank groove.

Making the substrate of the invention and part or all of the bank lyophilic includes at least one processing of ozone oxidation processing, plasma processing, corona processing, UV irradiation processing, electron beam irradiation processing, acid treatment, and alkali treatment.

According to this, it is possible to make the substrate and part or all of the bank lyophilic by including, as a treating method of making the substrate and part or all of the bank lyophilic, at least one processing of ozone oxidation processing, plasma processing, corona processing, UV irradiation processing, electron beam irradiation processing, acid treatment, and alkali treatment.

The plate member of the invention is flat plate-shaped or roll-shaped.

According to this, it is possible to transfer easily the liquid repellent deposited on the flat plate-shaped or roll-shaped plate member with respect to part or all of the upper surface of the bank formed on the substrate, thus providing part or all of the surface of the bank with liquid repellency.

The material of the plate member of the invention is an elastomer including at least a siloxane structure.

According to this, since the material of the plate member of the invention is an elastomer including at least a siloxane structure, the plate member as an elastic material can be obtained and adhesion between the substrate and part or all of the bank can be enhanced. Further, resistance to the liquid repellent can be secured.

The liquid repellent of the invention is a silane coupling agent or a high molecule exhibiting liquid repellency.

According to this, since the liquid repellent is a silane coupling agent or a high molecule exhibiting liquid repellency, strong liquid repellency is provided on part or all of the upper surface of the bank, so that the ink can be stably stored in the bank groove.

BRIEF DESCRIPTION OF THE DRAWINGS

The invention will be described with reference to the accompanying drawings, wherein like numbers reference like elements.

DESCRIPTION OF THE EMBODIMENTS

Embodiments of the invention will now be described in detail.

First Embodiment

A color filter is provided with a plurality of pixels arranged in a matrix pattern on a substrate, and a boundary between one pixel and another is separated by a convex partition member (hereinafter refereed to as the "bank"). An inside area partitioned by this bank is called a bank groove. To each pixel, any of filter materials (hereinafter refereed to as the "ink") of red (R), green (G), and blue (B) is ejected from the inkjet unit to form a color filter. While the shape of a pixel may be any of circular, elliptical, square, striped shapes, because of surface tension on ink components, it is preferable that corners of a square be round.

Further, in arranging red, green, and blue, there are a mosaic pattern, a stripe pattern, a delta pattern and the like, and in this embodiment, any other arrangement is acceptable.

In the embodiment, as a color filter forming method, there will be described steps of forming a substrate and a bank on the substrate, making the substrate and part or all of the bank lyophilic, and coating a liquid repellent on part or all of the upper surface of the bank.

Flowchart of the Step of Forming a Substrate and a Bank on the Substrate

Figure 1:
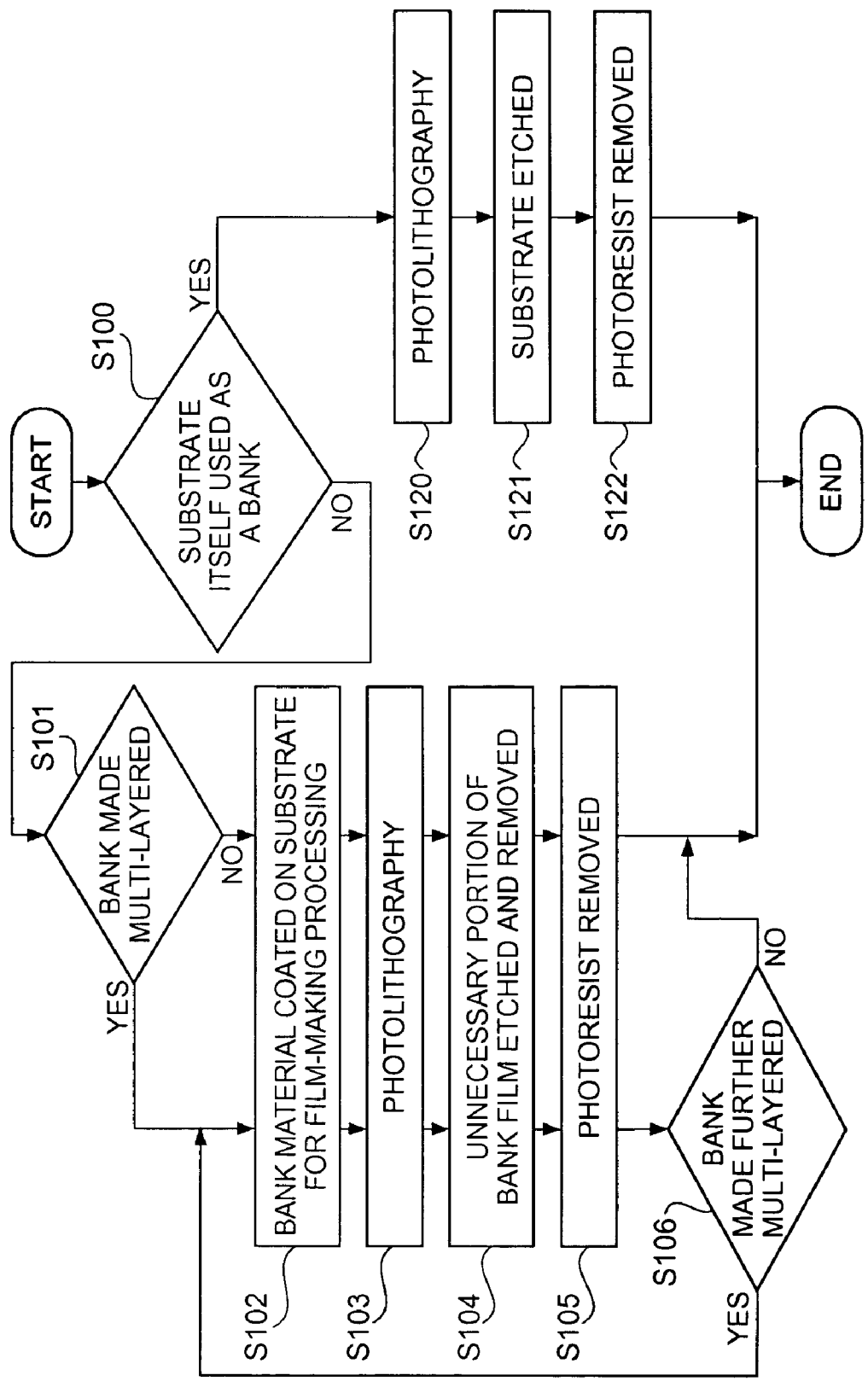
FIG. 1 is a flowchart of a step of forming a substrate and a bank on the substrate.

FIG. 1 is the step of forming a substrate and a bank on the substrate. In the embodiment, in step (hereinafter referred to as "S") 100 a choice is made as to whether or not to use the substrate itself as a bank. If the substrate itself is not used as a bank, proceed to S101, and if the substrate itself is used as a bank, proceed to S120.

At this point, as the material of the substrate, there is a material which is any of or a combination of respective materials such as a transparent or semi-transparent inorganic substrate material composed of glass, quartz and the like, a single crystal or non-single crystal semiconductor substrate material such as diamond, silicon, and germanium types, further, a substrate material composed of a ceramic and the like, or general-purpose plastics such as a polyethylene resin type, polystyrene resin type, polyethylene terephthalate resin type, polyacryl resin type, and polymethacrylic resin, and engineering plastics such as polycarbonate resin type, polyester resin type, polyamide resin type, polyacetal resin type, polyamideimide resin type, polyimide resin type, polyetherimide resin type, epoxy resin type (including glass-contained), polysulfon resin type, polyethersulfon type, polyether resin type, polyetherketone resin type, polyethernitryl resin type, polyphenylenether resin type, polyphenylensulfide resin type and polyphenol resin type.

A case of not using the substrate itself as a bank will be described.

In S101, whether or not to make a bank on the substrate 10 multi-layered is selected. In case of not making the bank multi-layered but single layered (NO), S102 to S105 are carried out only once.

Further, in case of selecting "the bank to be multi-layered" (YES), S102 to S105 are repeatedly carried out for the number of times of multi-layering.

In S102, the bank material is coated or deposited on part or all of the substrate then to be subjected to film-making processing such as heat treating and/or optical processing to obtain a desired bank film. Heat treating and/or optical processing refers to activating a substance constituting the bank film through heating, UV irradiation, infra-red irradiation, visible ray irradiation and the like, causing it to react so as to obtain performance as the bank film.

Hereinafter, this processing is called film-making processing. A film thus obtained is called hereinafter as the bank film. It is preferable that a thickness (height) of the bank film as a height of the bank is more than 1 μm The bank material herein refers to any one material or a combination of respective materials of an inorganic substrate material, a semiconductor substrate material, a ceramic substrate material as an inorganic material or general-purpose plastic or engineering plastic as an organic material. Especially, in case of selecting "the bank to be multi-layered" in S101, the bank is made up by combining these materials.

Further, a method of coating or depositing the bank material in S102 will be described.

As coating methods, there are available a spin coat method in which a bank film of a desired thickness is obtained by supplying the liquid bank material to a substrate that is rotating; a spray coat method which sprays the liquid bank material being made into vapor or mist through a medium; a roll coat method in which the liquid bank material is supplied to a plurality of rotating rolls to adjust to a desired thickness, whereas at least one roll is made to contact the substrate, thus transferring the bank material from the roll to the substrate; a dye coat method which supplies the liquid bank material to inside a squeeze, from a tip of which uniform coating is carried out on the substrate; and a dip coat method which stores the liquid bank material in a container, so that coating is carried on after dipping the substrate therein and pulling it up at a uniform rate.

As a method of forming the bank film obtained in S102 of the same figure into a desired pattern, there is photolithography.

In photolithography of S103, there is applied a mask fitting a shape of the bank which is then coated with a photoresist, exposed and developed. Then, in S104, any unnecessary portion of the bank film is removed by etching, and in S105, the photoresist is removed to obtain the desired shape of the bank. Details will be given later.

In case of selecting to multi-layer the bank (YES) in S110, proceed to S102, and the bank material the same as or different from the first time is coated on the bank obtained at the first time and subjected to film-making processing. The succeeding processing is repeated for a number of times equal to the desired number of multi-layers.

A case of using the substrate itself as the bank will be described.

The case of using the substrate itself as the bank is selected in S100 of the same figure, and in photolighography of S120, the mask fitting the shape of the bank is applied, while the liquid photoresist is coated, exposed and developed. A portion of the substrate having no photoresist of a photoresist pattern built on the substrate according to photolithography in S121 is etched by an acidic solvent such as phosphoric acid, sulfuric acid and nitric acid or an alkaline solvent, and in S122 the photoresist is removed to obtain a concavity of a desired depth on the substrate. This concavity is used as a bank groove.

Step of Forming a Bank on the Substrate by Photolithography

Figure 2A:
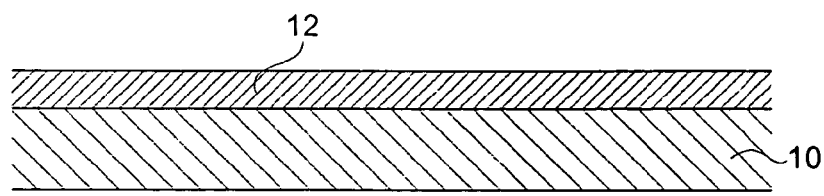
FIGS. 2A to 2F show sectional views of a substrate explaining the step of forming a bank by etching a bank film through photolithography.
Figure 2B:
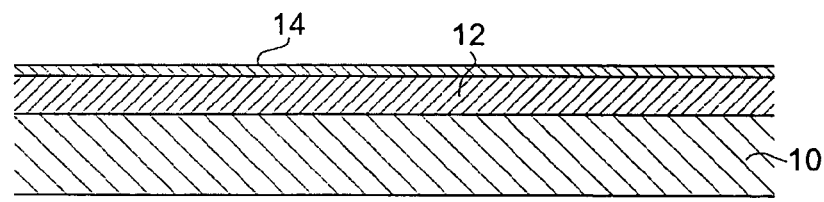

FIG. 2A to 2F are sectional views of the substrate explaining a step of forming a bank on the substrate by etching the bank film by photolithography. In FIG. 2A, the case of not making the bank multi-layered (NO) is selected, and a bank film 12 is formed on part or all of the substrate 10 as explained in S102 of FIG. 1. In FIG. 2B, a photoresist 14 is formed on part or all of the bank film 12 of FIG. 2A.

Figure 2C:
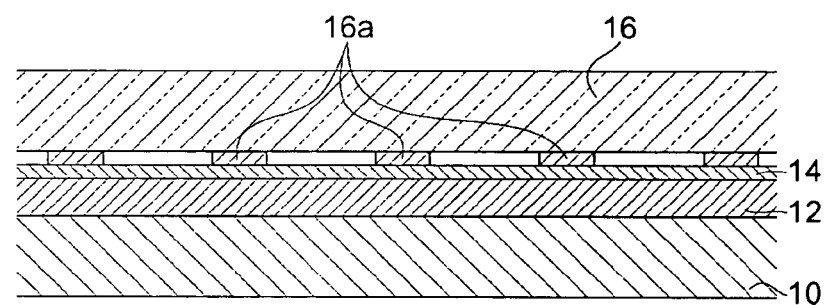

In FIG. 2C, in a manner of adhering to the formed photoresist 14, a photomask 16 is applied, and on a surface of the closely adhered photoresist 16, a desired pattern is applied.

In the embodiment, a positive photoresist is used. Parallel rays of light irradiated from above the photomask 16 are irradiated only on a portion having no photomask pattern 16A.

Figure 2D:
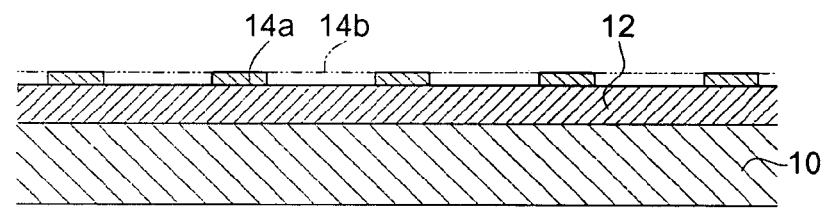

In FIG. 2D, the photoresist 14, on which rays of light have been irradiated, is where a chemical reaction takes place due to those rays of light, and becomes soluble in a developer. When a surface of the photoresist 14 is sufficiently dipped in the developer, an unnecessary photoresist 14b dissolves therein. Further, a necessary photoresist 14a does not dissolve in the developer. Adhesion of the necessary photoresist 14a to the bank film may be enhanced by heating.

Figure 2E:
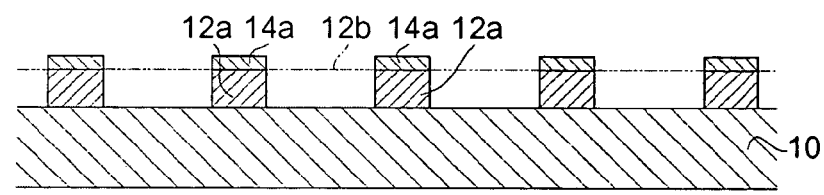

In FIG. 2E, a solvent dissolving the bank film 12 (hereinafter referred to as the "etchant") is supplied to the surface of the bank film, dissolving and removing any unnecessary bank film 12b having no necessary photoresist 14a. The necessary bank film 12a is secured between the necessary photoresist 14a and the substrate 10.

Figure 2F:
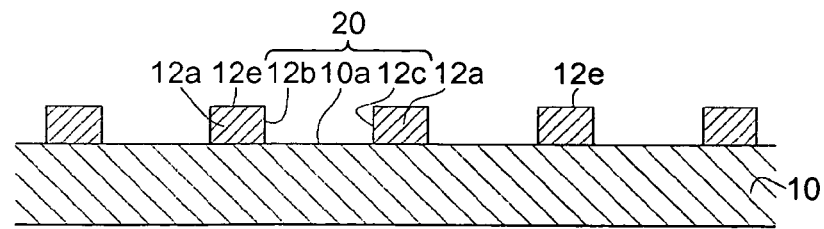

In FIG. 2F, the necessary photoresist 14a is removed by an exfoliation solvent with the necessary bank film 12 being patterned and formed on the substrate 10.

In the embodiment, a concavity, which is formed by a bank wall side face 12d of the other necessary bank film 12a making up a pixel opposite to a bank wall side face 12c of one necessary bank film 12a and a surface 10a of the substrate 10, is called a bank groove 20. Further, an upper surface of the necessary bank film 12a is called the bank's upper surface 12e.

At this point, into a material of the bank film 12, for example, there are mixed black, blue, and grey pigments or dyes, and the bank film 12 is coated on the substrate 10, subjected to film-making processing as well as the steps of the embodiment. Then, the necessary bank film 12a shows black, blue, and grey.

This enables the bank film 12a to be used as a shielding layer to shield light passing the color filter of the invention. Color tones and color density of the pigments or dyes to be mixed are not limited to the above-referenced colors. Further, the material of the bank film 12 may be either an inorganic material or an organic material.

FIG. 3A to 3E are sectional views of the substrate explaining the steps (S120, S121, and S122) of forming a bank by etching the substrate through photolithography in the flowchart of FIG. 1.

Figure 3A:
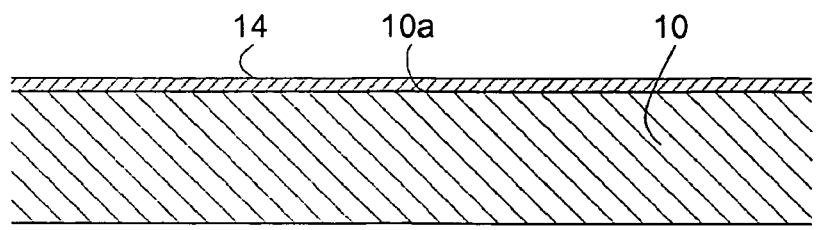
FIGS. 3A to 3E show sectional views of a substrate explaining the step (S120, S121, and S122) of forming a bank by etching the substrate according to photolithography in the flowchart of FIG. 1.

FIG. 3A is a step of forming the photoresist 14 on the substrate 10 in S120. The forming method and the material are the same as S103. A difference between S120 and S103 is that the bank film 12 is not disposed on the substrate 10 while the photoresist 14 is formed on the substrate 10.

Figure 3B:
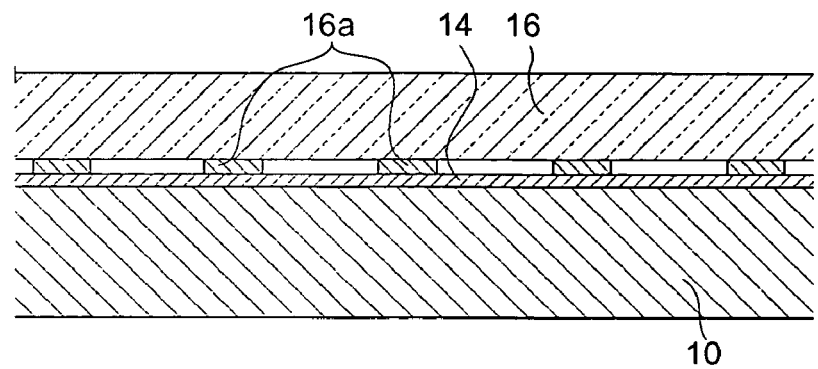

In FIG. 3B, the photomask 16 is applied in S120, and the parallel rays of light are irradiated from a portion having no photomask pattern 16a, hence, the parallel rays of light are irradiated only on the photoresist 14 opposite to the portion having no photomask pattern 16a.

Figure 3C:
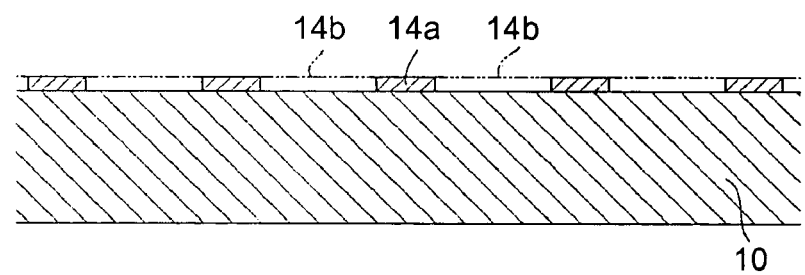

In FIG. 3C, the photoresist 14, on which the light has been irradiated is where a chemical reaction takes place due to that light and becomes soluble in the developer. When the surface of the photoresist 14 is sufficiently dipped in the developer, the unnecessary photoresist 14b dissolves in the developer. Further, the necessary photoresist 14a does not dissolve in the developer. Adhesion of the necessary photoresist 14a to the bank film may be enhanced by heating.

Figure 3D:
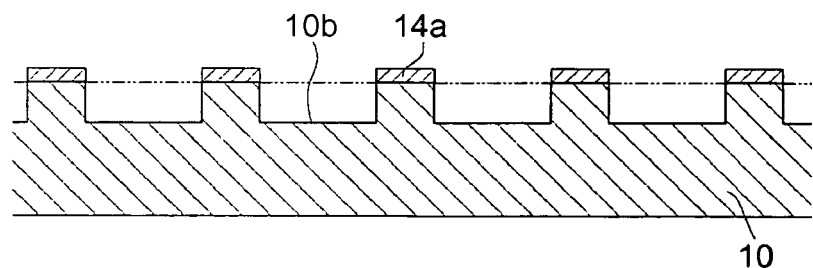

In FIG. 3D, a solvent dissolving the substrate 10 (hereinafter referred to as the "substrate etchant") is supplied to the necessary photoresist 14a and the surface of the substrate 10, dissolving the substrate 10 of the portion having no necessary photoresist 14a, removing down to a desired depth, and obtaining a desired concave pattern 10b. Any substrate etchant is acceptable so long as it does not dissolve the necessary photoresist 14a but the substrate 10.

Figure 3E:
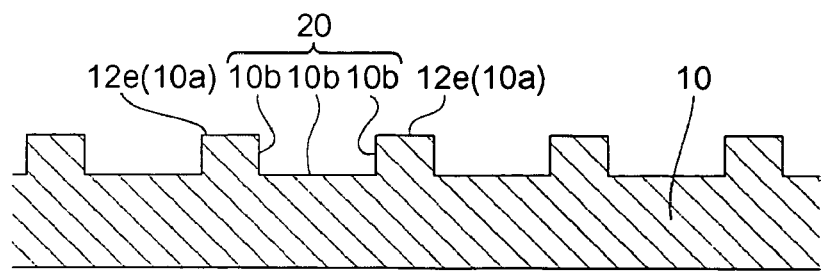

In FIG. 3E, in S122, there is obtained a desired concave pattern 10b of the substrate whose necessary photoresist 14a is removed by the exfoliation solvent and which is etched. In the embodiment, this desired concave pattern 10b is used as the bank groove 20.

Further, the surface 10a of the substrate 10 which is not etched is called the bank's upper surface 12e.

Step of Making the Substrate and Part or All of the Bank Lyophilic

Figure 4A:
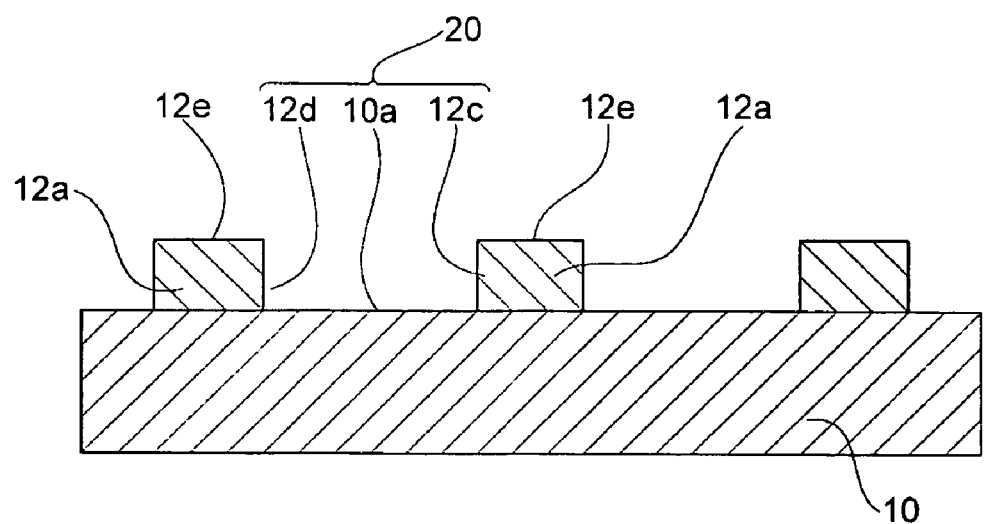
FIG. 4A is a sectional view of a substrate 10 on which a necessary bank film 12a is formed.
Figure 4B:
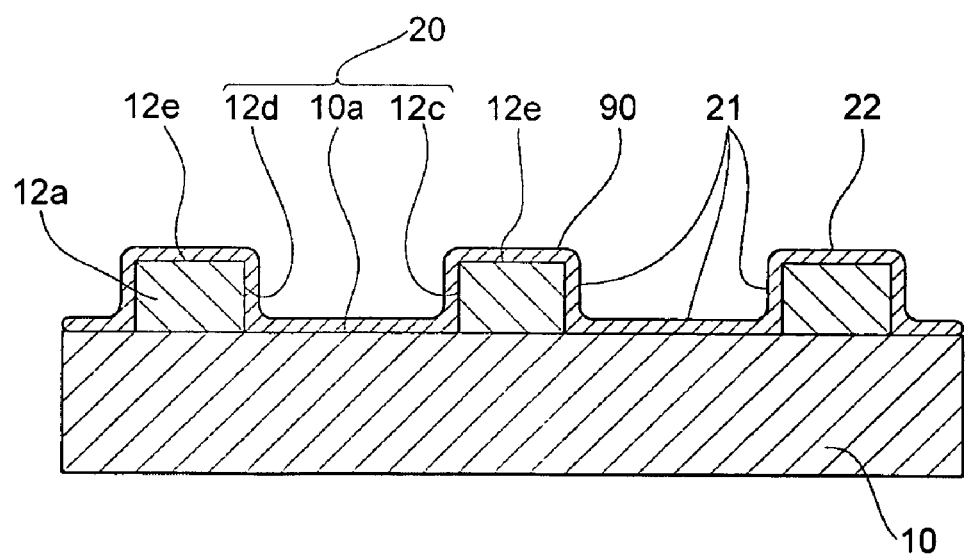
FIG. 4B is a sectional view of the substrate 10 which is made lyophilic through a step of making the substrate and part or all of the bank lyophilic.

FIG. 4A is a sectional view of the substrate 10 with formation of the necessary bank film 12a on the substrate 10, and FIG. 4B is a sectional view of the substrate 10 which is made lyophilic by the step of making the substrate and part or all of the bank lyophilic.

FIG. 4A shows the bank groove 20 on the substrate 10 built according to the method of S102 to S105 in FIG. 1.

In FIG. 4A, the necessary bank film 12a is formed on the substrate 10 as referenced above, and the bank groove 20 is constituted by the surface 10a of the substrate 10, the bank wall side face 12c of the necessary bank film 12a, and the bank wall side face 12d of the necessary bank film 12a. The bank groove 20 is where a color filter pixel becomes. To each bank groove 20, any of red (R), green (G), and blue (B) inks is ejected from the inkjet ejection unit (not illustrated) to form the color filter.

In FIG. 4B, a step of making the lyophilic property (lyophilic processing) will be described.

The step of making the lyophilic property (lyophilic processing) is processing designed to facilitate getting wet with respect to water. The processing extends to the bank groove 20, the substrate 10, and part or all of the bank's upper surface 12e, whereas a film made to be lyophilic of a processed surface is shown as a lyophilic film 90 in the same figure.

The bank groove 20 covered with this lyophilic film 90 is specifically called a lyophilic bank groove 21. Further, the bank's upper surface 12e covered with this lyophilic film 90 is specifically called a lyophilic bank's upper surface 22. At this point, the lyophilic bank groove 21 is an area not including the lyophilic bank's upper surface 22.

As a specific example of lyophilic processing, there may be illustrated ozone oxidation processing, plasma processing, corona processing, UV irradiation processing, electron beam irradiation processing, acid treatment, alkali treatment and the like.

Further, it is processing performed as necessary according to surface characteristics of the groove 20, the substrate 10, and the bank's upper surface 12e. For example, if an organic matter which is the bank groove 20 and the surface of the substrate 10 should include a polar group such as a hydroxyl radical, an aldehyde radical, a keton radical, an amino radical, an imino radical, a carboxyl radical, and a silanol radical, the lyophilic processing step may be omitted.

The lyophlic bank groove 21 and the substrate 10 subjected to lyophilic processing show a contact angle under 20° with respect to water.

Step of Coating a Liquid Repellent on Part or All of the Bank's Upper Surface

Next, the step of coating a liquid repellent 50 on part or all of the lyophilic bank's upper surface 22 will be described.

This step is processing to make part or all of the lyophillic bank's upper surface 22 difficult to wet with respect to water. This is a step of making the lyophillic bank's upper surface 22 liquid repellent by depositing the liquid repellent 50 on the plate member 51 which is a separate member from the substrate 10, and by making this plate member 51 come into contact with the bank's upper surface 12e on the substrate 10, whereby the liquid repellent 50 is transferred to part or all of the lyophilic bank's upper surface 22.

Figure 5A:
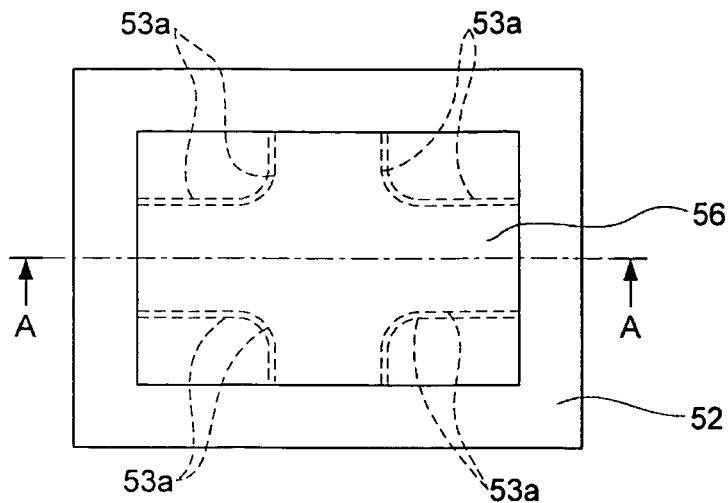
FIGS. 5A to 5C are a top sectional view and a perspective view explaining a manufacturing method of a flat plate-shaped plate member.
Figure 5B:
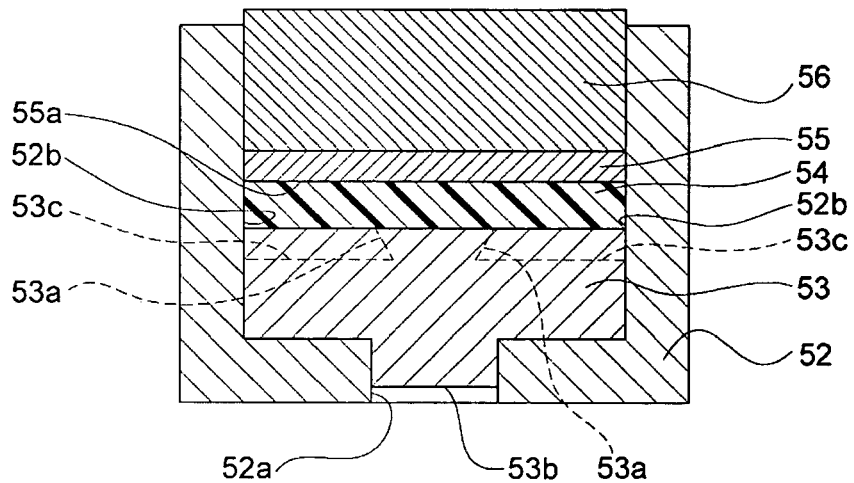
Figure 5C:
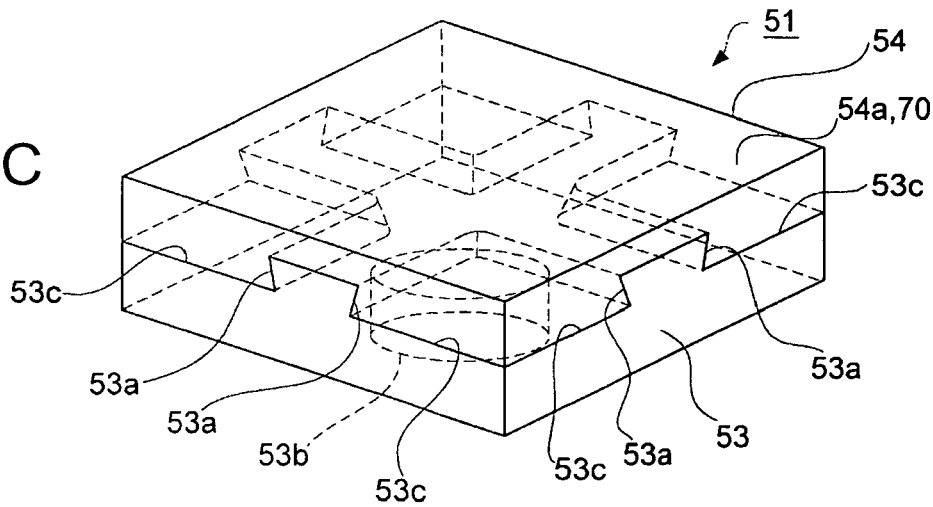

FIGS. 5A to 5C are plan sectional views and a perspective view to explain a manufacturing method of a flat plate-shaped plate member.

FIG. 5A is a plan view when manufacturing the flat plate-shaped plate member, FIG. 5B is a sectional view along line A-A of FIG. 5A when manufacturing the flat plate-shaped plate member, and FIG. 5C is a perspective view of the completed flat plate-shaped plate member.

In FIG. 5A, to manufacture a flat plate-shaped plate member 51, first a stamp body 53 is inserted from above a mold 52. A guide port 52a is disposed on the bottom of the mold 52, and a projection 53b extending from the stamp body 53 downward is engaged thereto.

Further, the mold 52 and the stamp body 53 are engaged to each other. Above the stamp body 53 is disposed a projection equipped with a pair of opposite slant surfaces 53a in a manner of shrinking an interval downward.

After inserting the stamp body 53 from above the mold 52, a liquid stamping agent 54 is poured into a concave area made up of the mold 52 and the stamp body 53. The liquid stamping agent 54 which has been poured in is poured until an area including a surface 53c of the stamp body 53, the slant surface 53a and an internal wall surface 52b of the mold 52 is filled.

Upon charging the liquid stamping agent 54, a flat plate 55 whose one face is at least provided with a flat surface 55a, for example, silicon wafer or glass, is inserted from above the mold 52, grasping the liquid stamping agent 54.

In this case, the liquid stamping agent 54 is coated over the flat surface 55a of the flat plate 55 in advance, so that no air will enter into between the flat surface 55a of the flat plate 55 and the liquid stamping agent 54. Any plate having a flat surface is acceptable for the flat plate 55, and there is no special restriction.

After the flat plate 55 is inserted into the mold 52, an energizing member 56 is inserted. In the embodiment, by using a weight of the energizing member 56, the flat plate 55 and the liquid stamping agent 54 are energized. However, an air cylinder or a spring may be used from above for energizing. The mold 52 and the energizing member 56 may also be screwed in.

In this manner, a system in which respective members are installed is left at room temperature for 24 hours. Further, it may be heated. Through this processing, the liquid stamping agent 54 may be hardened in an elastic condition.

At this point, a material of the stamping agent 54 as the material of the plate member will be described. As the material of the stamping agent 54, polydimethylsiloxane (PDMS) (KE131OST manufactured by Shin-etsu Chemical Industry) is used. After it is mixed with a resin material that hardens through a reaction mechanism of an addition type, and a hardener, it is left at room temperature for 24 hour hours or by a heating device, then it hardens in an elastic condition.

For example, a reaction in case of causing the liquid stamping agent 54 to react so as to mold an elastic body, either a shrinking type or the addition type may be used. However, since the shrinking type showing a line contraction rate of about 0.5% generates a gas in a process involving reaction of high molecules, it is preferable to use an elastic material based on the reaction mechanism of the addition type having a line contraction rate of about 0.1%.

Further, as the stamping agent 54, it is preferable to use an elastomer including a siloxane structure to enhance adhesion of the substrate 10 and the lyophilic bank's upper surface 22.

For example, an elastomer of the plydimethylsiloxane (PDMS) type which is a silane compound may be cited. A structural formula of this high molecule can be expressed by $Si(CH_3)_3$—O—$(Si(CH_3)_2O)_n$—$Si(CH_3)_3$, where n is a positive integer. By using this material, a surface treating agent to be coated on the lyophilic bank's upper surface 22 to be explained later can be absorbed or deposited on the surface of the molded plate face 54a.

FIG. 5C is a perspective view of the plate member 51 detached from the mold 52 with the stamping agent 54 in a hardened condition provided with elasticity.

The stamping agent 54 including a plurality of slant surfaces 53a and faces 53c of the stamp body 53 is affixed. The projection 53b disposed on the stamp body 53 is used at a later step for installing the plate member 51 on another device. Further, the plate face 54a of the stamping agent 54 is a flat surface due to the flat surface 55a of the flat plate 55.

On the plate face 54a of the plate member 51a, a liquid repellent high molecule solution (UniDaikin TG-656, manufactured by Daikin Industry) as the surface treating agent 70 is coated by a spinner at a revolution of 3000 rpm for 30 seconds. By means of coating this surface treating agent 70, the plate face 54a is provided with liquid repellency.

Step of Coating Liquid Repellent on Part or All of Bank's Upper Surface

Figure 6A:
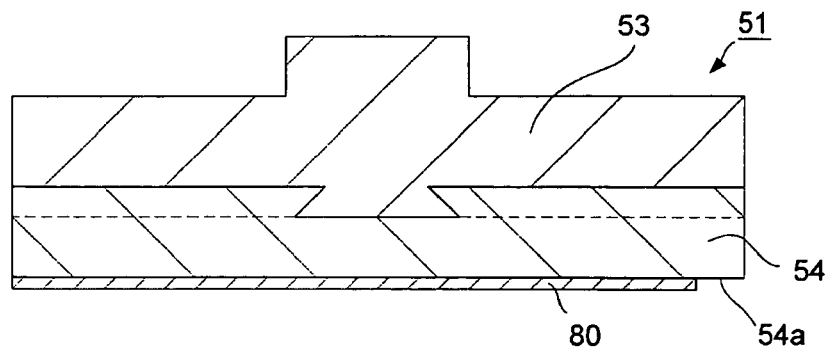
FIGS. 6A to 6C are sectional views of the substrate 10 and a plate member 51 explaining the step of coating a liquid repellent 80 on part or all of an upper surface 22 of a lyophilic bank formed on the substrate 10.
Figure 6B:
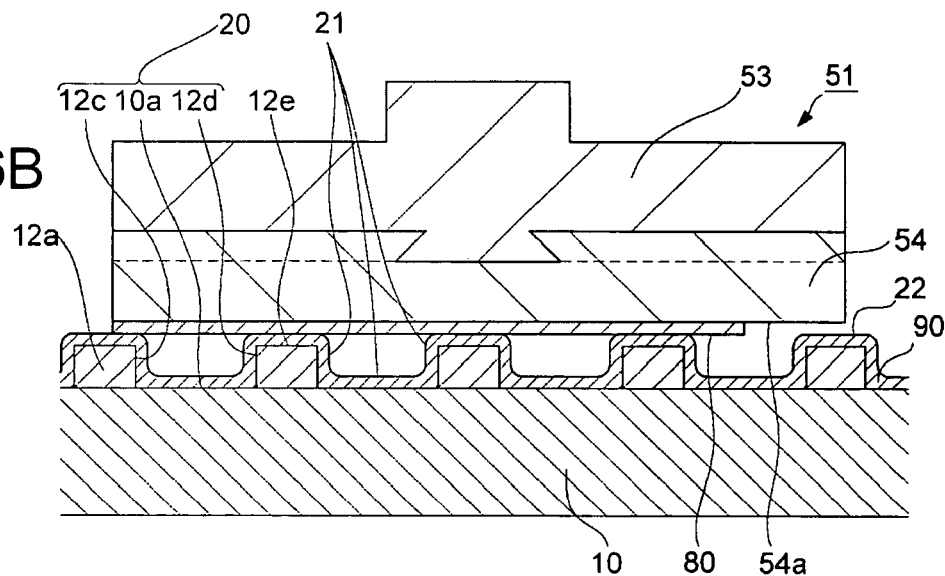
Figure 6C:
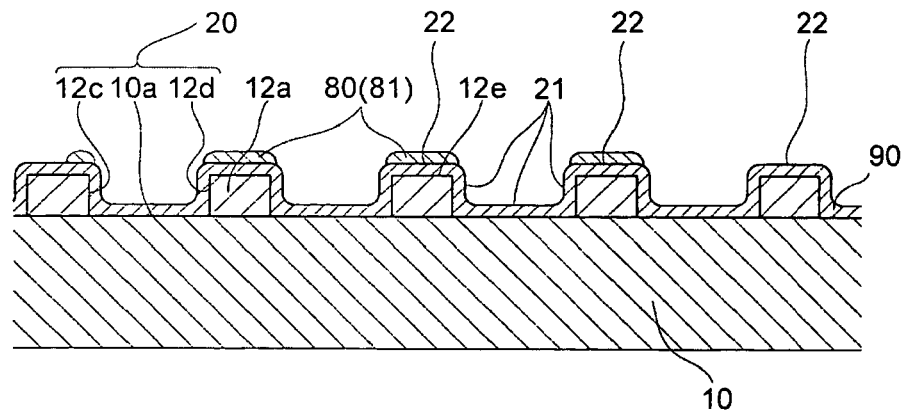

FIGS. 6A to 6C are sectional views of the substrate 10 and the plate member 51 to explain the step of coating the liquid repellent 80 on part or all of the lyophilic bank's upper surface 22 formed on the substrate 10.

FIG. 6A is a sectional view of the plate member 51 on which the liquid repellent 80 is coated. The liquid repellent 80 is coated on part or all of the plate face 54a of the stamping agent 54 with which the plate member 51 is equipped. As the liquid repellent 80, for example, there may be used a silane coupling agent (organic silicon compound), which features an end functional group of a molecule that selectively performs chemical adsorption of substrate constituting atoms, as well as a surface reactant.

The silane coupling agent is a compound expressed by $R^1SiX^1mX^2(3-m)$, where $R^1$ is an organic radical, $X^1$ and $X^2$ are —$OR^2$, —$R^2$, and —Cl, $R^2$ is an alkyl radical of a carbon number 1 to 4, and m is an integer from 1 to 3.

Further, the surface reactant is a compound expressed by $R^1Y^1$, where $Y^1$ is a lyophilic polar radical, —OH, —(CH$_2$CH$_2$O)$_n$H, —COOH, —COOK, —COONa, —CONH$_2$, —SO$_3$H, —SO$_3$Na, —OSO$_3$H, —OSO$_3$Na, —PO$_3$H$_2$, —PO$_3$Na$_2$, —PO$_3$K$_2$, —NO$_2$, —NH$_2$, —NH$_3$Cl (ammonium salt), —NH$_3$Br (ammonium salt), ≡NHCl (pyridinium salt), ≡NHBr (pyridinium salt) and the like.

The silane coupling agent features chemical adsorption with respect to a hydroxyl group on the substrate surface. Since it shows reactivity on the surface of oxides of a wide range of materials such as metals and insulators, it can be suitably used as the liquid repellent 80.

Of these silane coupling agents and surface reactants, R$^1$ is modified by a florine atom-containing compound having perfluoroalkyl structure C$_n$F$_{2p+1}$ or a perfluoroalkylether structure C$_p$F$_{2p+1}$O(C$_p$F$_{2p}$O)$_r$. Its surface free energy on the surface of a solid becomes less than 25 mJ/m$^2$, and its affinity with a material having polarity becomes less, hence, it is suitably used.

To be more specific, as the silane coupling agent, there may be cited CF$_3$—CH$_2$CH$_2$—Si(OCH$_3$)$_3$, CF$_3$(CF$_2$)$_3$—CH$_2$CH$_2$—Si(OCH$_3$)$_3$, CF$_3$(CH$_2$)$_5$—CH$_2$CH$_2$—Si(OCH$_3$)$_3$, CF$_3$(CH$_2$)$_3$—CH$_2$CH$_2$—Si(OCH$_3$)$_3$, CF$_3$(CF$_2$)$_7$—CH$_2$CH$_2$—Si(OCH$_3$)$_3$, CF$_3$(CF$_2$)$_{11}$—CH$_2$CH$_2$—Si(OC$_2$H$_5$)$_3$, CF$_3$(CF$_2$)$_3$—CH$_2$CH$_2$—Si(CH$_3$)(OCH$_3$)$_2$, CF$_3$(CF$_2$)$_7$—CH$_2$CH$_2$—Si(CH$_3$)(OCH$_3$)$_2$, CF$_3$(CF$_2$)$_8$—CH$_2$CH$_2$—Si(CH$_3$)(OC$_2$H$_5$)$_2$, CF$_3$(CF$_2$)$_8$—CH$_2$CH$_2$—Si (C$_2$H$_5$)(OC$_2$H$_5$)$_2$, CF$_3$O(CF$_2$O)$_6$—CH$_2$CH$_2$—Si(OC$_2$H$_5$)$_3$, CF$_3$O(C$_3$F$_6$O)$_4$—CH$_2$CH$_2$—Si(OCH$_3$)$_3$, CF$_3$O(C$_3$F$_6$O)$_2$(CF$_2$O)$_3$—CH$_2$CH$_2$—Si(OCH$_3$)$_3$, CF$_3$O(C$_3$F$_6$O)$_8$—CH$_2$CH$_2$—Si(OCH$_3$)$_3$, CF$_3$O(C$_4$F$_9$O)$_5$—CH$_2$CH$_2$—Si (OCH$_3$)$_3$, CF$_3$O(C$_4$F$_9$O)$_5$—CH$_2$CH$_2$—Si(CH$_3$)(OC$_2$H$_5$)$_2$, CF$_3$O(C$_3$F$_6$O)$_4$—CH$_2$CH$_2$—Si(C$_2$H$_5$)(OCH$_3$)$_2$ and the like. However, it is not limited to these structures.

Further, as surface reactants, there are cited CF$_3$—CH$_2$CH$_2$—COONa, CF$_3$(CF$_2$)$_3$—CH$_2$CH$_2$—COONa, CF$_3$(CF$_2$)$_3$—CH$_2$CH$_2$—NH$_3$Br, CF$_3$(CF$_2$)$_5$—CH$_2$CH$_2$—NH$_3$Br, CF$_3$(CF$_2$)$_7$—CH$_2$CH$_2$—NH$_3$Br, CF$_3$(CF$_2$)$_7$—CH$_2$CH$_2$—OSO$_3$Na, CF$_3$(CF$_2$)$_{11}$—CH$_2$CH$_2$—NH$_3$Br, CF$_3$(CF$_2$)$_8$—CH$_2$CH$_2$—OSO$_3$Na, CF$_3$O(CF$_2$O)$_6$—CH$_2$CH$_2$—OSO$_3$Na, CF$_3$O(C$_3$F$_6$O)$_2$(CF$_2$O)$_3$—CH$_2$CH$_2$—OSO$_3$Na, CF$_3$O(C$_3$F$_6$O)$_4$—CH$_2$CH$_2$—OSO$_3$Na, CF$_3$O(C$_4$F$_9$O)$_5$—CH$_2$CH$_2$—OSO$_3$Na, CF$_3$O(C$_3$F$_6$O)$_8$—CH$_2$CH$_2$—OSO$_3$Na, and the like. However, it is not limited to these structures.

Furthermore, as the liquid repellent 80, liquid repellent high molecule compounds may be used. For example, as the liquid repellent high molecule compound, an oligomer or a polymer containing a fluorine atom in its molecule can be used. Specific examples include ethylene, ester, acrylate, methacrylate, vinyl, urethane, silicon, imide, carbonate type polymer having a long chain perfluoroalkyl structure such as polytetrafluoroethylene (PTFE), ethylenetetrafluoroethylene-copolymer, hexafluoropropylene-tetrafluoroethylene-copolymer, polyvinylidene fluoride (PVdF), poly(pentadecafluoroheptylethylmethacrylate) (PPFMA), and poly(perfluorooctylethylacrylate).

It is preferable that a film (hereinafter referred to as the "liquid repellent 81") of the liquid repellent 80 which has been transferred has a thickness under 10 nm so as not to affect the lyophilic bank's upper surface 22, and a film thickness under 5 nm is more preferable.

Further, as a method of coating the liquid repellent 80 onto the plate face 54a of the stamping agent 54, there may be used a general coating method, such as an extrusion coating method, a spin coating method, a gravure coating method, a reverse roll coating method, a rod coating method, a slit coating method, a micro gravure coating method, a dip coating method, and an inkjet coating method.

FIG. 6B is a sectional view of the substrate 10 and the plate member 51 explaining to transfer the liquid repellent 80 of the plate face 54a to the lyophilic bank's upper surface 22 of the substrate 10 by making the plate 54a, on which the liquid repellent 80 is coated, come into contact with the lyophilic bank's upper surface 22 of the substrate 10.

First, an adjustment is made of a parallel degree of the plate 54a to the lyophilic bank's upper surface 22 which is part of the lyophilic film 90 of the substrate 10. Next, energizing is applied to between the plate 54a and the lyophilic bank's upper surface 22 to such an extent that the stamping agent 54 provided with elasticity undergoes a slight deformation.

As a result, no liquid repellent 80 is coated on the lyophilic bank groove 21, thus retaining the lyophilic property of the lyophilic bank groove 21 as is. Since the slight deformation of the stamping agent 54 may cause the liquid repellent 80 to de deposited on the lyophilic bank groove 21, it is preferable for a height (thickness) of the necessary bank film 12a to be more than 1 μm.

FIG. 6C is a sectional view of the substrate 10 to explain a condition in which the liquid repellent 80 is transferred onto the lyophilic bank's upper surface 22 of the substrate 10 after the plate member 51 is detached from the lyophilic bank's upper surface 22 of the substrate 10.

The liquid repellent 80 is transferred only to a section where the plate member 54a contacted the lyophilic bank's upper surface 22 of the substrate 10, while no liquid repellent 80 is transferred to a section where no contact is made. This means that it is a method of transferring to part of the lyophilic bank's upper surface 22. The liquid repellent 80 may be transferred to all of the lyophilic bank's upper surface 22.

To enhance the liquid repellency of the liquid repellent 80 of the transferred lyophilic bank's upper surface 22, after the step of transferring, it is preferable specifically to use processing such as heat treating and exposure to reactive vapor in a step to obtain the liquid repellent film 81 by fixing the liquid repellent 80 with respect to the substrate 10.

For example, in case of the silane coupling agent, reaction proceeds by subjecting the substrate to high temperature or to a high humidity environment at room temperature. As a specific example, so as to cause reaction and fixing of the liquid repellent high molecules as the liquid repellent 80 on the lyophilic bank's upper surface 22 of the substrate 10, there is a method of applying heat in an oven heated to 150° C. for 1 minute.

In this manner, as the coated liquid repellent 80 is fixed to the substrate 10 to become the liquid repellent film 81 as a thin film of the liquid repellent high molecules, only the lyophilic bank's upper surface 22 of the substrate 10 exhibits liquid repellency. The surface is treated to be liquid repellent through the liquid repellent high molecules of the liquid repellent film 81 generated by the transferred liquid repellent 80, so that the liquid repellent film 81 may have a high contact angle of more than 90° with respect to water.

Figure 7A:
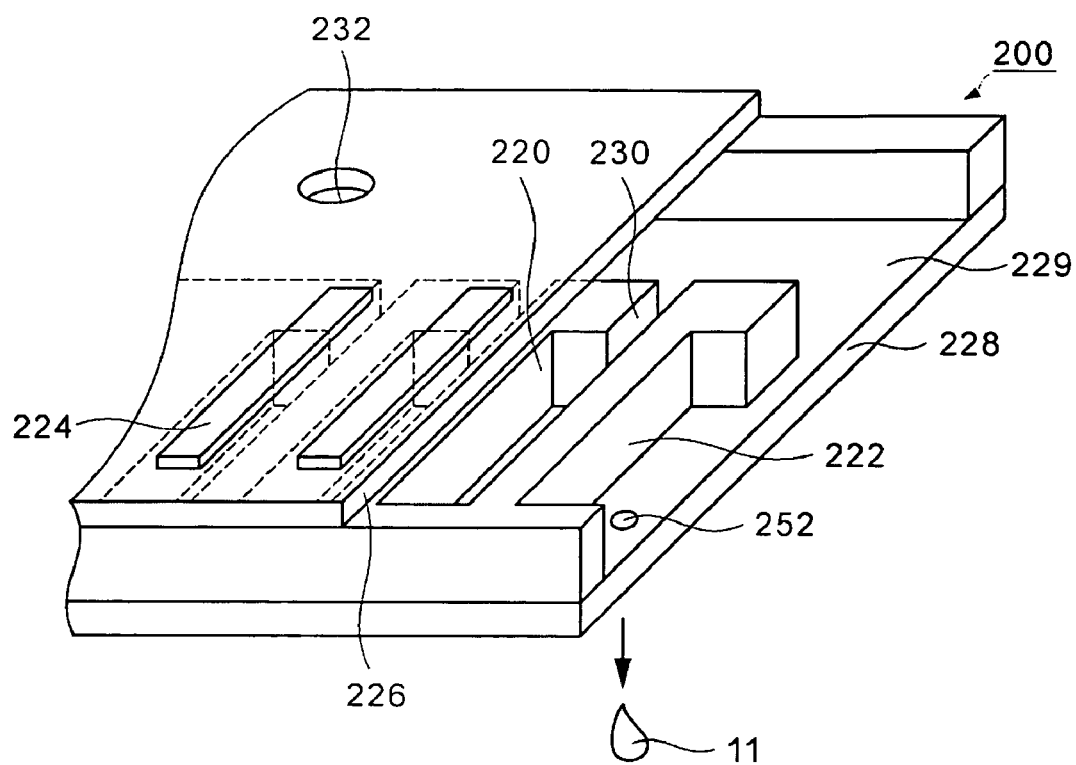
FIG. 7A is a sectional perspective of an entire liquid droplet ejection head 200.
Figure 7B:
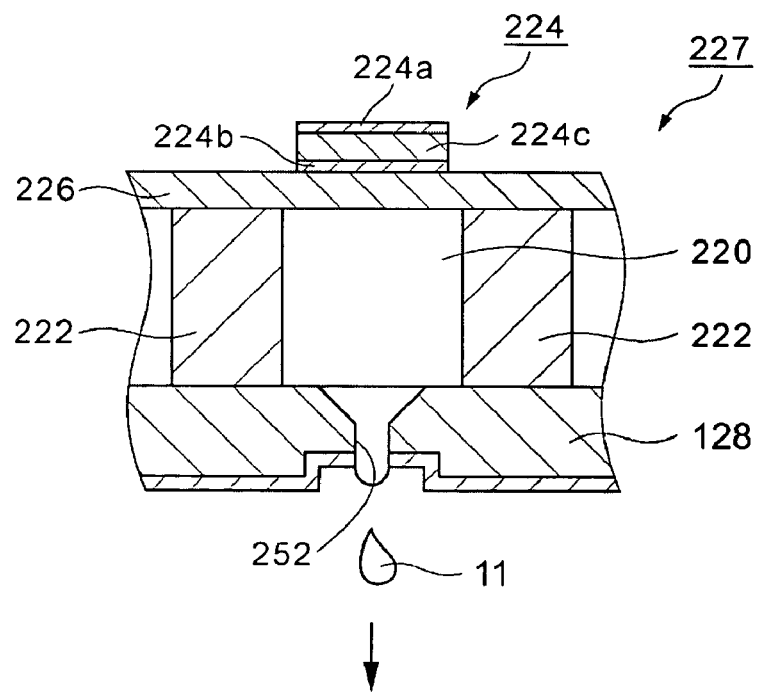
FIG. 7B is a detailed sectional view of an ejection unit.

FIG. 7A is a sectional perspective view of an entire liquid droplet ejection head 200 and FIG. 7B is a detailed sectional view of the ejection unit.

Each liquid droplet ejection head 200 is an inkjet liquid droplet ejection head. Each liquid droplet ejection head 200 is equipped with a vibration plate 226 and a nozzle plate 228. Between the vibration plate 226 and the nozzle plate 228, there is positioned a minute liquid puddle 229 which is filled with any of the red (R), green (G), and blue (B) inks.

Further, between the vibration plate 226 and the nozzle plate 228, there are positioned a plurality of partitions 222. And a portion surrounded by the vibration plate 226, the nozzle plate 228, and a pair of partitions 222 is a cavity 220.

Since the cavity 220 is provided corresponding to a nozzle 252, the number of the cavities 220 and the number of the nozzles 252 are the same. The ink 11 which is any of the red (R), green (G), and blue (B) inks is supplied from the minute liquid puddle 229 through a supply port 230, which is positioned between a pair of partitions 222, to the cavity 220.

In FIG. 7B, a vibrator 224 is positioned on the vibration plate 226 corresponding to each cavity 220. The vibrator 224 includes a piezo-electric element 224c and a pair of electrodes 224a and 224b which grasps the piezo-electric element 224c.

By impressing a drive voltage between this pair of the electrodes 224a and 224b, the ink 11 of any of the red (R), green (G), and blue (B) inks is ejected from the corresponding nozzle. It should be noted that a shape of the nozzle 252 is adjusted such that the ink 11 may be ejected from the nozzle 252 in a z-axis direction.

In the embodiment, the "ink 11" herein means a material having a viscosity capable of being ejected from the nozzle. In this case, it does not matter whether the material is water-based or oil-based. So long as it has a fluidity (viscosity) cable of being ejected from the nozzle, it is sufficient, and even if a solid matter should be mixed in it, as long as the entire material is fluid, it is acceptable.

It is preferable for the viscosity of the ink 11 to be more than 1 mPa·s and under 50 mPa·s. If the viscosity is less than 1 mPa·s, when a liquid droplet of the ink 11 is ejected, a periphery of the nozzle 252 tends to be contaminated by the ink 11 which flows out.

On the other hand, if the viscosity is more than 50 mPa·s, clogging frequency at the nozzle 252 becomes high, thus making it difficult for the liquid droplet to be ejected smoothly.

In the embodiment, a part including one nozzle 252, the cavity 220 corresponding to the nozzle 252, and the vibrator 224 corresponding to the cavity 220 may be expressed as the "ejection unit 227." According to this nomenclature, one liquid droplet ejection head 200 has the same number of ejection units 227 as the number of the nozzles 252. The ejection unit 227 may have an electric heat conversion element instead of a piezo-electronic element. Namely, the ejection unit 227 may be configured such as to eject a material by using thermal expansion of the material by the electric heat conversion element.

Now, the material of the ink 11 will be described.

For the ink 11, what is used is, for example, as follows: after an inorganic pigment or an organic pigment is dispersed, as a pigment, in a polyurethane resin oligomer, it is added with cyclohexanone and butyl acetate as a low boiling point solvent and butylcarbitolacetate as a high boiling point solvent with a further addition of 0.01% by weight of a nonionic surface reactant as a dispersant, so that its viscosity is 6 to 8 mPa·s.

Consequently, by separately dispersing each inorganic pigment of red (R), green (G), and blue (B), the inks 11 of red (R), green (G), and blue (B) are produced.

Figure 8:
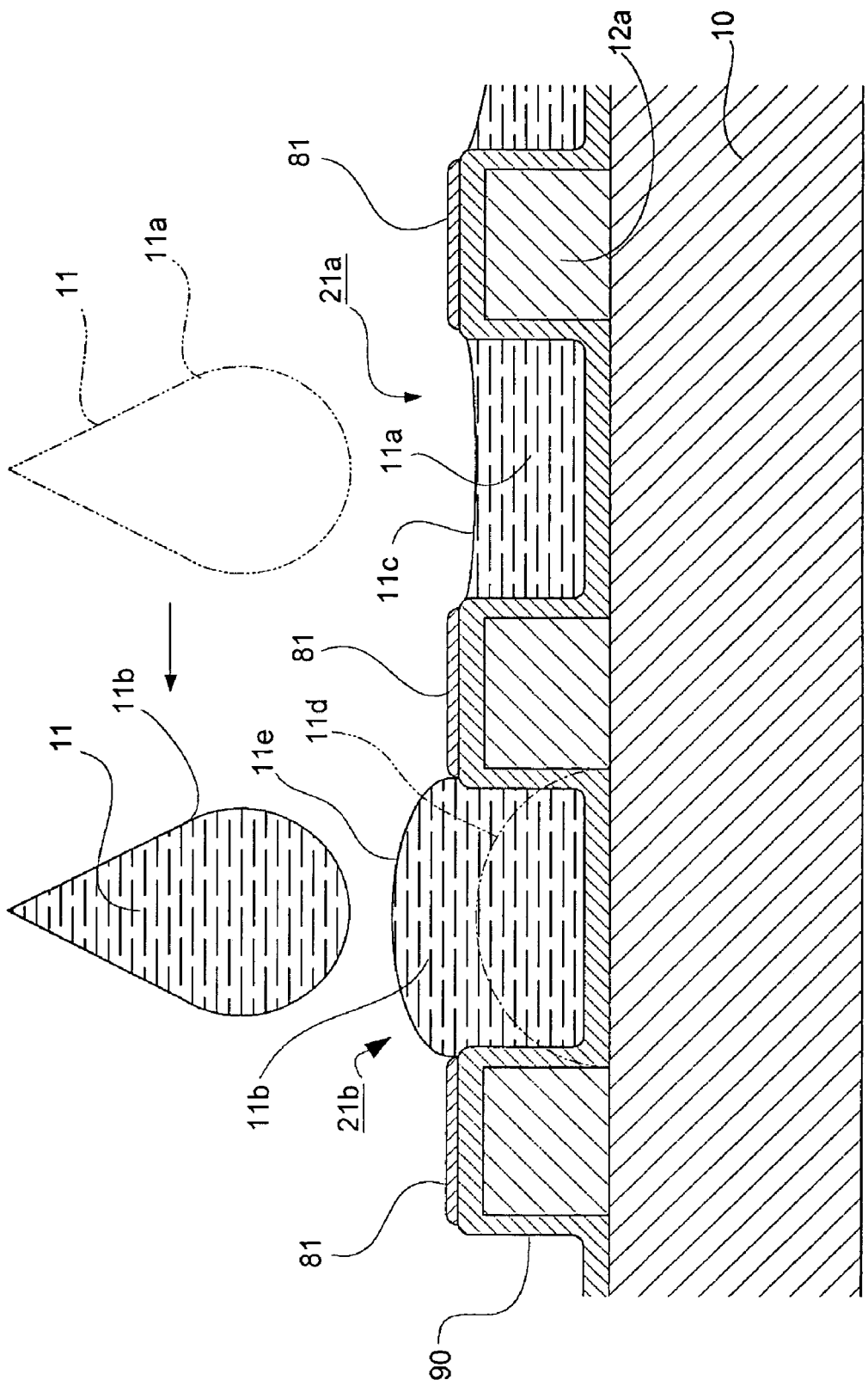
FIG. 8 is a sectional view explaining a relationship between any of ink 11 of red (R), green (G), and blue (B) ejected from the liquid droplet ejection head 200, and the substrate 10.

FIG. 8 is a sectional view explaining a relationship between any of the red (R), green (G), and blue (B) inks 11 and the substrate 10. The ink 11 ejected from the liquid droplet ejection head 200 reaches the substrate 10 in a shape of a shell. The position for ejection is controlled by the liquid droplet ejection unit (not illustrated) with respect to the lyophilic bank groove 21 and a proper amount of the ink 11 is ejected.

The ink 11 illustrated in the figure is what is ejected from the liquid droplet head 200 equipped with the liquid droplet ejection unit.

The ink 11, for example, red (R) ink 11a is ejected by the liquid droplet ejection head 200 from right to left of the figure and stays in the lyophilic bank groove 21a. Next, for example, green (G) ink 11b is ejected by the liquid droplet ejection head 200 and stays in the lyophilic bank groove 21b.

In this case, since the inside of the lyophilic bank grooves 21a and 21b are, as referenced above, made to be lyophilic by the lyophilic film 90, the ink 11 can stay easily in the lyophilic bank grooves 21a and 21b. And since the inks 11a and 11b are ejected up to the brim of the height of the lyophilic bank grooves 21a and 21b, the ink 11 can stay.

Consequently, it is possible to increase the amount of the ink 11a to be ejected from the liquid droplet ejection head 200 to obtain easily an approximately horizontal state for a liquid surface 11c of the ink 11 which is ejected to the lyophilic bank groove 21a and stays there. If the thickness of the ink 11a inside the lyophilic bank groove 21a is approximately uniform, the concentration of the pigment dispersed in the ink 11a is approximately uniform. Hence, if drying processing to be explained later is applied and the solvent of the ink 11a evaporates, the density of the color inside the lyophilic bank groove 21a can be made uniform and heavy.

Further, if the position of arrival (hereinafter referred to as the "impact position") of the ink 11a ejected by the liquid droplet ejection head 200 to the substrate 10 suffers a slight slippage, causing the ink 11a trickle on the liquid repellent film 81, the ink 11a is repulsed by the liquid repellency of the liquid repellent film 81 such as to be drawn into the lyophilic bank groove 21a, thus making it possible to prevent it from mixing with the ink 11b of other adjacent color.

Next, the ink 11 staying in each of the lyophilic bank grooves 21a and 21b as pixels ejected from the liquid droplet ejection head 200 are subject to drying.

First, after leaving it in natural atmosphere for 3 hours, it is heated on a 80° C. hot plate for 50 minutes, then, it is heated in an oven at 200° C. for 30 minutes. By carrying out this drying processing of the ink 11, it is possible to form color filters of red (R), green (G), and blue (B) on the substrate.

If the amount of the ink 11 is large in the lyophilic bank groove 21b, the liquid surface 11e of the ink 11 rises to a position higher than the liquid repellent film 81. Even in this case, according to the embodiment, due to the liquid repellency of the liquid repellent film 81, it is possible to prevent it from flowing to the lyophilic bank groove 21a as its adjacent pixel.

The advantageous effect of the embodiment will be as follows.

1. If the lyophilic processing is not applied to the bank groove 20 (refer to FIG. 4), there is poor wetability between the ink 11 and the bank groove 20, presenting the liquid surface 11d shown in double dot lines in the same figure. A center of the bank groove 20 has a large thickness, while the periphery of the bank groove 20 has almost no thickness.

Consequently, while there were problems of uniformity and the density of color in each pixel of red (R), green (G), and blue (B), they are solved in the embodiment.

2. Since mixing a pigment or a dye in the bank film 12 enables the necessary bank film 12a to function as the shielding layer, use of the color filter formed according to the method of the embodiment makes it possible to provide a display unit having a large contrast ratio.

Second Embodiment

Next, a second embodiment will be described with reference to the drawings.

In the embodiment, parts different from a first embodiment are mentioned, while parts not mentioned are the same as a first embodiment.

Figure 9A:
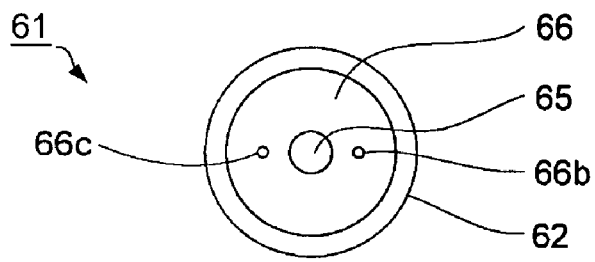
FIGS. 9A to 9C are a plan sectional view and a perspective view showing a manufacturing method of a roll-shaped plate member 61.
Figure 9B:
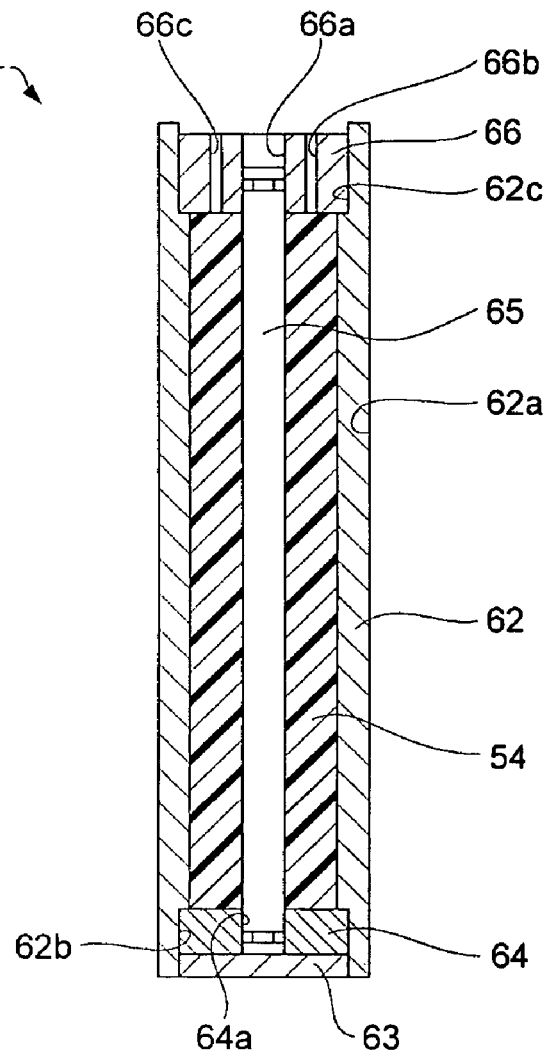
Figure 9C:
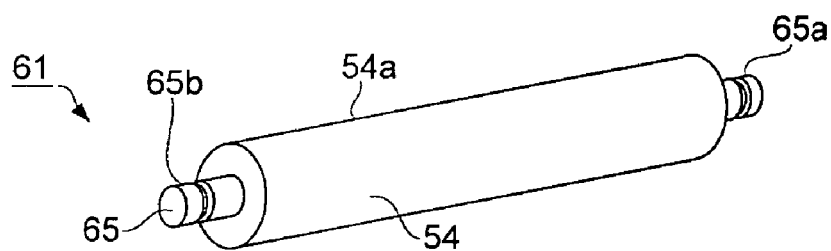

FIGS. 9A to 9C are plan sectional views and a perspective view to explain a step of manufacturing a roll-shaped plate member 61. FIG. 9A is a plan sectional view to explain a step of manufacturing the plate member 61. An inside wall 62a of a mold 62 is subjected to cylindrical grinding in good precision finish in terms of circularity and cylindricity. Below the mold 62, there is provided a step hole 62b having the same concentricity as the inside wall 62a, so that a bottom plate 64 having a hole 64a in the center engages a bottom plate 63. The liquid stamping agent 54 stated in a first embodiment is poured into this.

A central axis 65 is inserted from above the mold 62, and one end of the central axis 65 is inserted into the hole 64a in the center of the bottom plate 64. A lid 66 engaging a step 62c provided at an upper part of the mold 62 is inserted from above the mold 62, and insertion is carried out while engaging a hole 66a provided on the lid 66 to the other end of the central axis 65.

From relief ports 66b and 66c provided on the lid 66, it is designed such that any excess liquid stamping agent 54 will flow out to outside the mold 62. By processing these members in the same way as in a first embodiment, the liquid stamping agent 54 solidifies. The solidified stamping agent 54 and the central axis 65 part of which is contained in the stamping agent 54 are taken out of the mold 62.

FIG. 9C is a perspective view of the roll-shaped plate member 61 taken out of the mold 62.

Concentricity of projections 65a and 65b of the central axis 65 protruding from the stamping agent 54 and the plate face 54a of the stamping agent 54 is measured. If the measured concentricity is not favorable or if air bubbles should exist in the plate face 54a of the stamping agent 54, the plate face 54a is subjected to grinding with the projections 65a and 65b of the central axis 65 as a reference. In this case, since the stamping agent 54 has elasticity, it is best to grind with a heated sharp cutting tool.

The plate face 54a of the stamping agent 54 of the plate member 61 is processed by a surface treating agent 70 in the same way as in a first embodiment. The plate member 61 thus manufactured is attached to a device for roll coating and the like to coat the liquid repellent 80 mentioned in a first embodiment on the plate face 54a of the stamping agent 54 for a uniform thickness, for transfer to the lyophilic bank's upper surface 22 of the substrate 10 which is provided with the lyophilic bank groove 21. And the liquid repellent 80 is subjected to film-making processing to form the liquid repellent film 81.

The advantageous effect of the embodiment is stated as follows.

3. By making the stamping agent 54 provided in the plate member 61 into a roll shape, it is attached to a roll coating device and the like, thus making it possible to transfer consecutively and efficiently the liquid repellent 80 onto the lyophilic bank's upper surface 22 of the substrate 10.

Third Embodiment

Next, a third embodiment will be described with reference to the drawings.

In the embodiment, parts different from a first embodiment or a second embodiment are mentioned, while parts not mentioned are the same as a first embodiment or a second embodiment.

FIGS. 10A to 10D are sectional views of the substrate 10 to explain, by providing a shielding layer 95 on the substrate 10, a method of forming a color filter including the shielding layer 95.

Figure 10A:
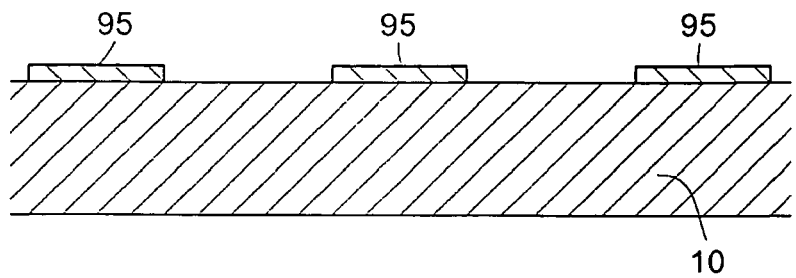
FIGS. 10A to 10D are sectional views of the substrate 10 explaining a color filter forming method, with provision of a shielding layer 95 on the substrate 10, including the shielding layer 95.

In FIG. 10A, the shielding layer 95 on the substrate 10 will be described. A chromium film of an average thickness of 0.2 μm is formed on the surface of the substrate 10 by sputtering or vapor deposition, then, this chromium film is made into a matrix pattern of pixels by photolithography.

This shielding layer 95 is also called black matrix, masking, by means of the shielding layer 95 of the color filter, wiring of optical control elements and the like to make them not visible. The black shielding layer 95 contributes to enhancing a contrast with light passing the red (R), green (G), and blue (B) inks used for the color filters. So long as the shielding layer 95 is a thin metallic film, opaque or semi-transparent organic material, it is acceptable.

Description will be made in case the shielding layer 95 is an opaque or a semi-transparent organic material. When forming the bank film 12 on the substrate 10, a pigment or a dye is mixed, as appropriate, in a liquid bank film material which will become the bank film 12. By doing so, the bank film 12 subjected to film-making processing functions as the shielding layer 95 which does not permit light to pass.

Further, if the shielding layer 85 is, for example, disposed between a pair of polarizing plates, by diffusing polarized light, it is possible to decrease light coming from one polarizing plate and let it function as the shielding layer 895. So long as an optical diffusive agent in this case is a material having a different refractive index from the liquid bank film material which will become the bank film 12, it is acceptable.

Figure 10B:
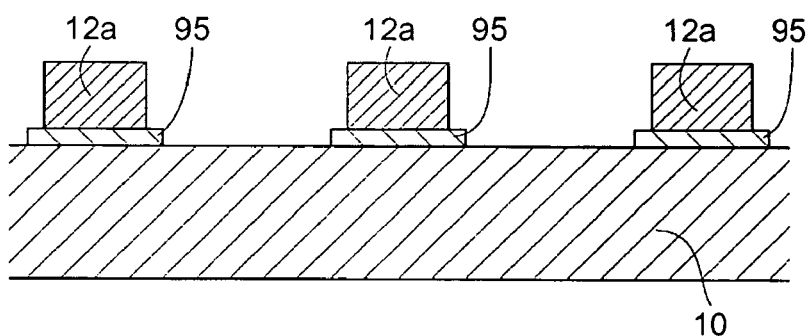

In FIG. 10B, the necessary bank film 12a is formed by using the above-referenced embodiment on the shielding layer 95 disposed on the substrate 10.

Figure 10C:
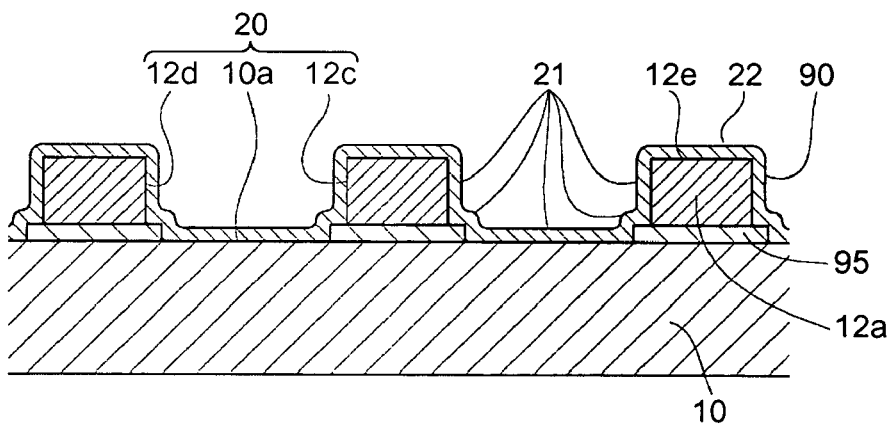

In FIG. 10C, lyophilic processing is carried out with respect to the substrate 10, the shielding layer 95, and the necessary bank film 12a to form the lyophilic film 90. Since the shielding layer 95 is wider than the necessary bank film 12a, unless the lyophilic film 90 is applied, there occurs a direct contact between the ink 11 and the shielding layer 95.

Depending on the material of the shielding layer 95, it may repel the ink 11, hence, the lyophilic film 90 is processed to be made lyophilic including the shielding layer 95.

A concavity constituted by an area of the bank wall side face 12c of the necessary bank film 12a, the bank wall side face 12d, part of the shielding layer 95 and the surface 10a of the substrate 10, is called the bank groove 20. An area of the groove 20 on which the lyophilic film 90 is disposed is called the lyophilic bank groove 21. Further, a part where the lyophilic film 90 is formed on a bank's upper surface 12e is called the lyophilic bank's upper surface 22.

Figure 10D:
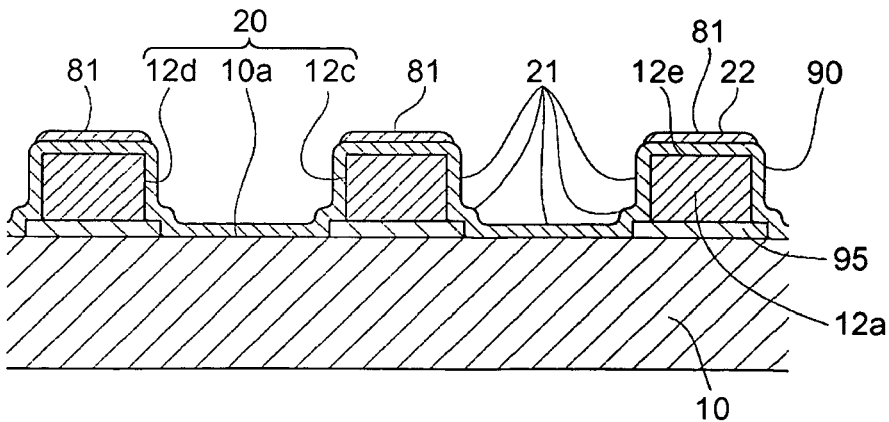

In FIG. 10D, in the same way as the above-referenced embodiment, the liquid repellent 80 is coated on the lyophilic bank's upper surface 22 by using the transfer method of the invention to obtain the liquid repellent film 81.

Figure 11:
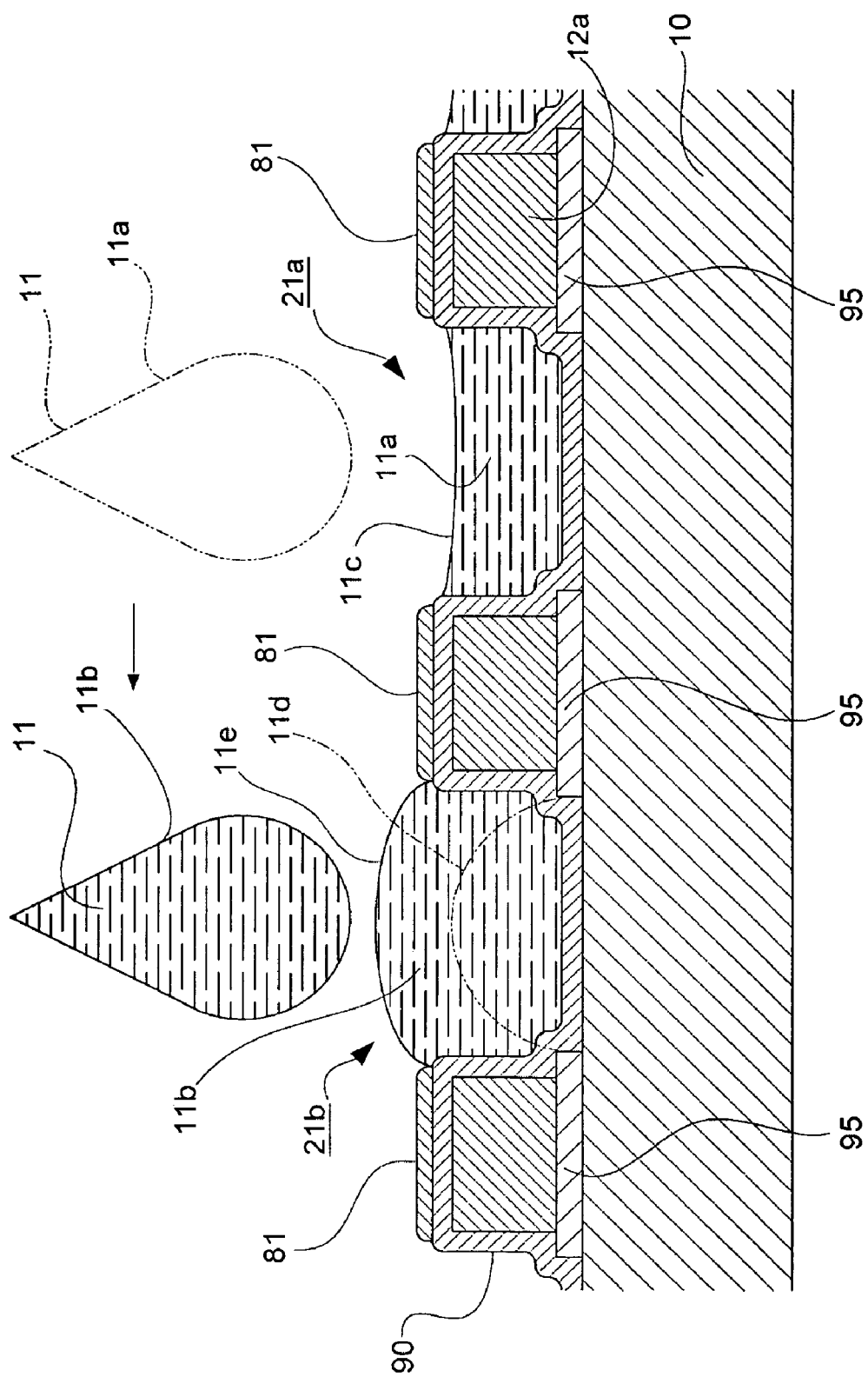
FIG. 11 is a sectional view explaining the relationship between any of the ink 11 of red (R), green (G), and blue (B) ejected from the liquid droplet ejection head 200, and the substrate 10.

FIG. 11 is a sectional view explaining a relationship between the ink 11 of any of the red (R), green (G), and blue (B) inks ejected from the liquid droplet ejection head 200 and the substrate 10. The ink 11 ejected from the liquid droplet ejection head 200 reaches the substrate 10 in the shape of a shell. By means of the liquid droplet ejection unit (not illustrated), a position for ejection to the lyophilic bank groove 21 including the shielding layer 95 is controlled such that the proper amount of the ink 11 is ejected. The ink 11 illustrated in the same figure is what is ejected from the liquid droplet ejection head 200 with which the liquid droplet ejection unit is equipped.

By means of the liquid droplet head ejection head 200 (refer to FIG. 7), the ink 11, for example, the ink 11a of red (R) is ejected from right to left of the same figure and stays in the lyophilic bank groove 21a, and next, for example, the ink 11b of green (G) is ejected and stays in the lyophilic bank groove 21b.

In this case, since the inside of the lyophilic bank grooves 21a and 21b is, as described above, made lyophilic as the shielding layer 95 is included due to the lyophilic film 90, the ink 11 can easily stay inside the lyophilic bank grooves 21a and 21b. Hence, the ink 11a and the ink 11b can be ejected and stay up to the brim of the height of the lyophilic bank grooves 21a and 21b.

Consequently, by increasing the amount of the ink 11a to be ejected from the liquid droplet head ejection head 200, it is possible for the liquid surface 11c of the ink 11, which is ejected to the lyophilic bank groove 21a and stays there, to obtain an approximately horizontal state easily. When the thickness of the ink 11a in the lyophilic bank groove 21a is in an approximately uniform state, the density of the pigment dispersed in the ink 11a is approximately uniform. Accordingly, if drying processing to be explained later is applied and the solvent of the ink 11a evaporates, the density of the color in the lyophilic bank groove 21a as the pixel can be made uniform and heavy.

Further, if the arrival position (hereinafter referred to as the "impact position") of the ink 11a ejected from the liquid droplet head ejection head 200 to the substrate 10 should suffer a slight slippage, trickling on the liquid repellent film 82, the ink 11a is repelled due to the liquid repellency of the liquid repellent film 81, thereby preventing it from being pulled into the lyophilic bank groove 21a and mixing with the adjacent ink 11b of the other color.

Next, the ink 11 staying in each of the lyophilic bank groove 21a and 21b as the pigment ejected from the liquid droplet head ejection head 200 is subjected to drying.

First, the color filters of red (R), green (G), and blue (B) can be formed on the substrate 10 by carrying out drying of the ink 11, which is as follows: after leaving the ink 11 for 3 hours in natural atmosphere, it is subjected to heating for 40 minutes on the 80° C. hot plate, and finally heating for 30 minutes in the oven in 200° C.

If the amount of the ink 1b is large in the lyophilic bank groove 21b, the liquid surface 11e of the ink 11b rises to a position higher than the liquid repellent film 81. Even in this case, according to the embodiment, due to the liquid repellency of the liquid repellent film 81, it is possible to prevent the ink 11b from flowing to the lyophilic bank groove 21a as the adjacent pixel.

The advantageous effect of the embodiment is stated as follows.

4. If lyophilic processing is not applied to the bank groove 20 (refer to FIG. 19), there is poor wettability between the ink 11 and the bank groove 20, so that the situation becomes as shown in the liquid surface 11d with double dot chain lines in the same figure. The center of the bank groove 20 has a large thickness, while the periphery of the bank groove 20 has hardly any thickness. Consequently, although there were problems of uniformity of the color in each pixel of red (R), green (G), and blue (B) and the density of color, they are solved by the embodiment.

Each embodiment of the invention is not limited to the foregoing and can be changed as follows.

VARIATION EXAMPLE 1

In the above-referenced embodiment, the plate face 54a has a smooth plane. But it may be formed to be convex and concave to fit the shape of the lyophilic bank groove 21 of the substrate 10, whereas the liquid repellent 80 may be coated on part or all of the lyophilic bank's upper surface 22 to form the liquid repellent film 81.

VARIATION EXAMPLE 2

In the above-referenced embodiment, the stamping agent 54 provided in the plate member 61 is in the roll shape. However, it may be formed to be convex and concave to fit the shape of the lyophilic bank groove 21 of the substrate 10, whereas the liquid repellent 80 may be coated on part or all of the lyophilic bank's upper surface 22 to form the liquid repellent film 81.

VARIATION EXAMPLE 3

In the above-referenced embodiment, the necessary bank film 12a is to be disposed on the shielding layer 95. A thin metallic film or an opaque organic material to serve as the shielding layer 95 is disposed on the entire surface of the substrate 10 by sputtering, vapor deposition, or any of the various coating methods.

This is followed by using photolithography to form a photoresist in a matrix pattern corresponding to the bank groove 20, then the substrate 10 is etched. On the surface 10a of the substrate 10 not subject to etching, the shielding layer 95 remains. The etched concavity serves as the bank groove 20 or the lyophilic bank groove 21, where the red (R), green (G), and blue (B) inks stay, and by carrying out drying processing, it can be used as simple color filters.

According to this, the shielding layer 95 and the bank groove 20 or the lyophilic bank groove 21 are concurrently produced, thus shortening the step. Further, there is no positional discrepancy between the shielding layer 95 and the bank groove 20 or the lyophilic bank groove 2.

VARIATION EXAMPLE 4

In the above-referenced embodiment, film-making processing is carried out by coating the bank film 12 on the substrate 10. However, a pigment or a dye may be mixed, as appropriate, in the photoresist which is subjected to photolithography to form a desired pattern, and this photoresist may be used as the necessary bank film 12a.

VARIATION EXAMPLE 5

In the above-referenced embodiment, liquid repellency is acquired through the liquid repellent 80, whereas a pixel, a dye or an optical diffusive agent may be put into this liquid repellent 80 to make it the shielding layer 95.

What is claimed is:

1. A color filter forming method, comprising:
   forming a bank on a substrate;
   making the substrate and part or all of the bank lyophilic; and
   coating a liquid repellent on part or all of an upper surface of the bank,
   wherein the liquid repellent is deposited on a plate member which is a different member from the substrate, and the liquid repellent transfers to a part or all of the upper surface of the bank as the plate member and the upper surface of the bank on the substrate come into contact with each other.

2. The color filter forming method, wherein a material of the bank according to claim 1 is an inorganic material or an organic material.

3. The color filter forming method, wherein a height of the bank according to claim 1 is more than 1 μm.

4. The color filter forming method, wherein the bank according to claim 1 is disposed on a shielding layer.

5. The color filter forming method, wherein making the substrate and a part or all of the bank lyophilic according to claim 1 includes at least one processing of ozone oxidation processing, plasma processing, corona processing, UV irradiation processing, electron beam irradiation processing, acid treatment, and alkali treatment.

6. The color filter forming method, wherein the plate member according to claim 1 is flat plate-shaped or roll-shaped.

7. The color filter forming method, wherein a material of the plate member according to claim 1 is an elastomer including at least a siloxane structure.

8. The color filter forming method, wherein the liquid repellent according to claim 1 is a high molecule which is a silane coupling agent or a high molecule exhibiting liquid repellency.

* * * * *